United States Patent [19]

Trunk et al.

[11] 4,041,524
[45] Aug. 9, 1977

[54] HEAT DISSIPATING DEVICE FOR TRANSISTOR WITH OUTWARDLY EXTENDING HEAT CONDUCTIVE TAB

[75] Inventors: Edmund G. Trunk, East Meadow; Alfred Skrobisch, Huntington Station, both of N.Y.

[73] Assignee: The Staver Company, Inc., Bay Shore, N.Y.

[21] Appl. No.: 670,000

[22] Filed: Mar. 24, 1976

Related U.S. Application Data

[63] Continuation-in-part of Ser. No. 537,089, Dec. 30, 1974, abandoned.

[51] Int. Cl.² ............... H01L 23/42; H01L 23/44; H01L 23/46; H01L 23/02
[52] U.S. Cl. .................................. 357/81; 357/79; 165/80; 165/105; 174/16 HS
[58] Field of Search ............ 357/80, 81, 79; 165/80, 165/105; 174/16 HS

[56] References Cited

U.S. PATENT DOCUMENTS

| 3,407,868 | 10/1968 | Coe ........................................ 357/81 |
| 3,548,927 | 12/1970 | Spurling ................................. 357/81 |
| 3,572,428 | 3/1971 | Monaco .................................. 357/81 |
| 3,670,215 | 6/1972 | Wilkens et al. ....................... 357/81 |
| 3,694,703 | 9/1972 | Wilens et al. ......................... 357/81 |
| 3,893,161 | 7/1975 | Pesak ..................................... 357/81 |

OTHER PUBLICATIONS

Wakefield Semiconductor Heat Sinks and Thermal Products Distributor product catalog No. 102.

*Primary Examiner*—Andrew J. James
*Attorney, Agent, or Firm*—James & Franklin

[57] ABSTRACT

The device comprises a body portion formed of a pair of substantially parallelly situated planar members spaced to receive the tab therebetween such that the interior surface of each member is parallel to and in engagement with the exterior surface of the tab adjacent therewith. In this manner, optimum heat transfer is achieved because the surface area of contact between the members and the tab is maximized by causing both sides of the tab to be in a heat conductive relationship with the device. Resilient connecting means situated at the ends of the members variably space the planar members with respect to each other such that tabs of different thicknesses can be accommodated and at the same time the parallel relationship between the members is maintained regardless of the spacing of the members to assure that the contact area is always maximized.

20 Claims, 6 Drawing Figures

HEAT DISSIPATING DEVICE FOR TRANSISTOR WITH OUTWARDLY EXTENDING HEAT CONDUCTIVE TAB

This application is a continuation-in-part of our co-pending application Ser. No. 537,089, filed Dec. 30, 1974, now abandoned.

The present invention relates to heat dissipating devices and, more particularly, to a heat dissipating device for use with a transistor having an outwardly extending heat conducting tab.

Transistors, like all other electrical components, generate heat during the operation thereof. The amount of heat generated by the transistor depends upon the particular transistor and the level of current at which the transistor is operated. With certain types of transistors, the heat generated during the operation thereof is capable of destroying the transistor if the heat is not dissipated. The problem of heat accumulation is notable in power transistors because of the high current level at which these transistors normally operate. In order to overcome this problem, power transistors are frequently provided with a brass or copper heat conductive wing or tab in thermal communication with the transistor. The wing or tab protrudes from the casing in which the transistor is mounted and provides a means for conducting the heat away from the transistor and then dissipating the heat to the environment. The wing or tab normally is positioned to protrude from the top of the transistor casing but may extend outwardly in any direction. This is known as the "power tab design".

If the heat can be drawn off this wing or tab at a higher rate, more power can be put through the transistor despite the greater heat generation caused by the power increase. Since the improved heat dissipation will prevent the interior temperature of the transistor from rising to a level that will damage the transistor, the transistor can be utilized at a higher operating level without being destroyed. Thus, in certain instances, it is desirable to employ a heat dissipating device to enhance the heat dissipating properties of the heat conductor tab.

It is necessary that the heat dissipating device used in conjunction with the tab or wing perform the heat transfer function efficiently by maximizing the area of contact between the tab and device in order to enhance heat transfer therebetween. In addition, the heat dissipating device should be easily affixed to the transistor tab, be inexpensive to manufacture, and be designed to accommodate tabs or wings of different sizes and thicknesses so that a single structure can be used at maximum heat transfer effectiveness with a variety of different types of transistors.

It is, therefore, the prime object of the present invention to provide a heat dissipating device for use with a transistor having an outwardly extending heat conductive tab which device maximizes heat transfer between the tab and the device, is easily affixed to the transistor tab, may be manufactured inexpensively, and can accommodate a variety of tabs having different sizes and thicknesses.

In accordance with the present invention, a heat dissipating device for use with a transistor having an outwardly extending heat conductive tab includes a body portion formed of a pair of substantially parallelly situated planar members spaced to receive a tab therebetween in a manner which maximizes the contact area between the tab and the members by maintaining contact between the device and both surfaces of the tab and, thus, provides for optimum heat transfer between the transistor and the device. Resilient connecting means are provided for variably spacing the planar members with respect to each other while maintaining the substantially parallel relationship therebetween, to permit insertion and retention of different thickness tabs between the members. Preferably, the connecting means are positioned on opposing ends of the body portion and each comprises a strip of heat conductive material in the form of an outwardly extending protrusion. Each end of the strip is integral with the end of a different one of the planar members such that the members and the connecting means form a single continuous closed body.

In this configuration, the connecting means perform a double function. Since these means are composed of heat conductive material and are fashioned into an outwardly extending protrusion, the heat conductivity of the connecting means coupled with the relatively large surface area of the connecting means per unit of space occupied thereby achieved by this configuration significantly enhances the overall heat dissipating properties of the device. In addition, the device may accommodate a variety of different size and type transistors because the resiliency of the connecting means permits variations in the distance between the planar members while retaining the planar members in a parallel configuration such that optimum heat transfer is always achieved. Thus, the planar members may be separated to different degrees to accommodate the different thicknesses of the tabs on various transistors. Moreover, this configuration permits relatively easy insertion of the tab into the device, as well as assuring that the planar members will firmly clamp the tab therebetween so that the device is securely affixed to the transistor.

To the accomplishment of the above and to such other objects as may hereinafter appear, the present invention relates to a heat dissipating device for use with a transistor having an outwardly extending heat conductive tab as defined in the appended claims and as described in the specification, taken together with the accompanying drawings in which:

Figure 1:
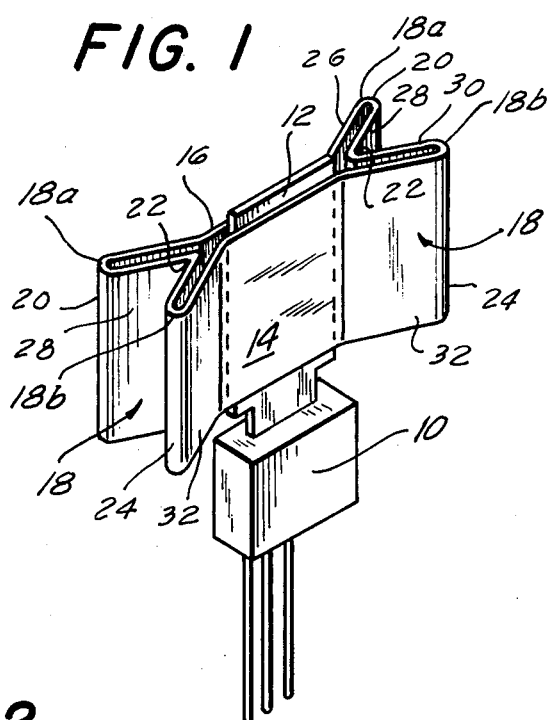
FIG. 1 is an isometric view of a first preferred embodiment of the heat dissipating device of the present invention showing the device affixed to the extending tab of a transistor.

Referring to the drawings, the heat dissipating device of the present invention is designed for use with a transistor of the type which is mounted within a casing 10. Situated on top of the casing is a vertically extending heat conductive tab 12 which is composed of a heat conductive material and which is in thermal communication with the transistor situated within casing 10 so that the heat generated by the transistor is transferred to the heat conductive tab 12. The heat dissipating device of the present invention comprises a body portion consisting of a pair of substantially parallelly situated planar members 14 and 16. Planar members 14 and 16 are spaced to receive tab 12 therebetween in the manner shown in the drawings. It should be noted that the parallel configuration of the planar members 14 and 16 permits the maximum area of contact to be achieved between the members and the tab at all times, thus assuring optimum heat transfer. This is due to the fact that the interior surface of each planar member is substantially parallel to and engages the exterior surface of the tab adjacent thereto. Thus, both sides of the tab are in a heat conductive relationship with the device. Resilient connecting means 18 are provided for variably spacing the planar members with respect to each other while retaining the parallel relationship therebetween such that tabs 12 of different sizes may be inserted and retained between the members.

Figure 2:
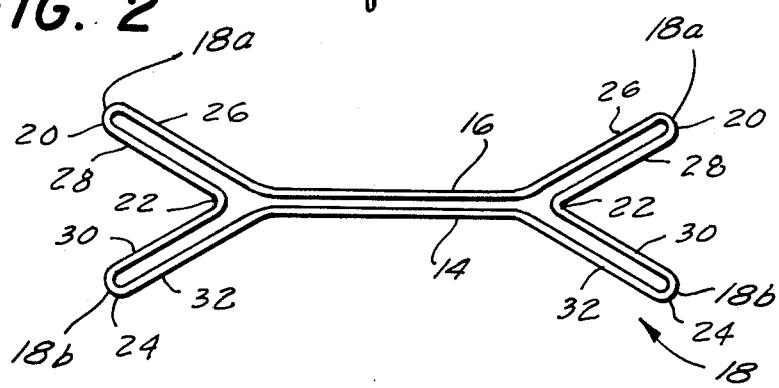
FIG. 2 is a top plan view of a first preferred embodiment of the heat dissipating device of the present invention.
Figure 3:
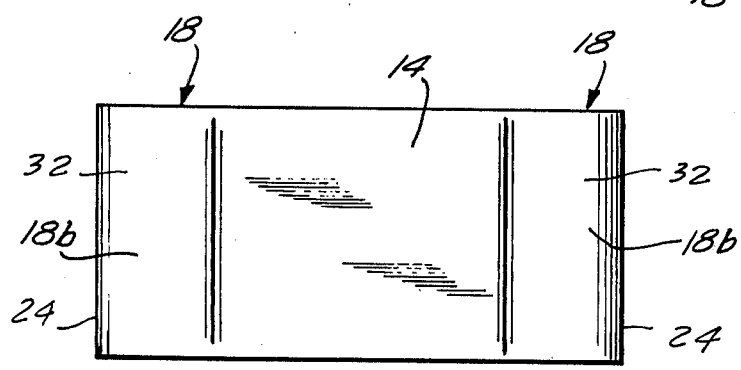
FIG. 3 is a front elevational view of a first preferred embodiment of the heat dissipating device of the present invention.

Preferably, connecting means 18 are positioned on opposing ends of the body portion such that the members 14 and 16 are substantially parallelly situated with respect to each other at all times. Each means 18 comprises a strip of heat conductive material, each end of which is connected to the end of a different one of the planar members. Connecting means 18 are preferably composed of the same heat conductive material as planar members 14 and 16. In order to enhance the heat conductive properties of the connecting means 18, the surface area thereof per unit volume occupied thereby is maximized without substantially increasing the overall size of the device. In the first preferred embodiment shown in FIGS. 1, 2 and 3, this is achieved by forming a pair of protrusions of each connecting means 18. Thus, in this embodiment, each of the connecting means 18 comprises a pair of protrusions 18a and 18b. The protrusions are formed from a single strip of material having three bends therein at 20, 22 and 24. The protrusions 18a and 18b are each formed from a pair of substantially parallel members 26, 28 and 30, 32, respectively. The remote ends of members 26 and 28 are connected at 20. The remote ends of members 30 and 32 are connected at 24. Members 28 and 30 are connected at 22. Member 26 is integral with member 16 and member 32 is integral with member 14, each of the members 26 and 32 forms an obtuse angle with the planar member integral therewith.

The double protrusion configuration tends to maintain the parallel orientation of planar members 14 and 16 while permitting relatively easy insertion of the tab therebetween. The spacial relationship between members 14 and 16 is maintained, at least partially, by the "V" shape formed by members 28 and 30 joined at 22. Since members 24 and 32 are parallel to members 28 and 30, respectively, the ends of planar members 14 and 16 integral therewith are retained at a given spaced relationship determined by the magnitude of the angle at 22. The span of the "V" shape of members 28 and 30 is relatively constant because the bend which forms the angle at 22 tends to be rigid. Thus, when planar members 14 and 16 are separated by the insertion of the tab therebetween, the connecting means urges the members towards their original spacial position. Since the forces on planar members 14 and 16 are equal at both ends thereof, the parallel relationship therebetween is maintained.

Even though the angle at 22 tends to remain unchanged as planar members 14 and 16 are separated, the pairs of members 26, 28 and 30, 32 connected at bends 20 and 24, respectively, provide sufficient resiliency to permit relatively easy insertion of the tab between planar members 14 and 16. This is primarily due to the length and flexibility of members 26, 28, 30 and 32. While the bends 20 and 24 tend to remain rigid and thus retain the shape of the connecting means, the members themselves flex to a certain extent thus giving the device a resilient character. This permits relatively easy insertion of the tab and also assures that the tab will be securely clamped between the planar members.

It should be further noted that this configuration of spaced parallel members 26, 28 and 30, 32 provides a large surface area per unit volume occupied. This, in combination with the heat conducting properties of the material from which the connecting means are made, significantly enhances the heat dissipating properties of the connecting means. In this manner, the overall efficiency of the device is increased while desirable mechanical and structural properties are achieved. Since the connecting means 18 are preferably integral with the planar members, the members and the connecting means form a single continuous closed body. In this manner, the entire device can be formed from a single strip of material fashioned and work-hardened into the required shape. As a result of the resiliency of connecting means 18, the space between the planar members may be varied while the parallel relationship therebetween is maintained such that transistor tabs of various thicknesses can be accommodated by a single design and, thus, the heat dissipating device of the present invention can be used with a variety of different types of transistors. The heat dissipating device of the present invention may be manufactured relatively inexpensively as it may be formed of a single strip of heat conductive material, fashioned and work-hardened into the required shape.

Figure 4:
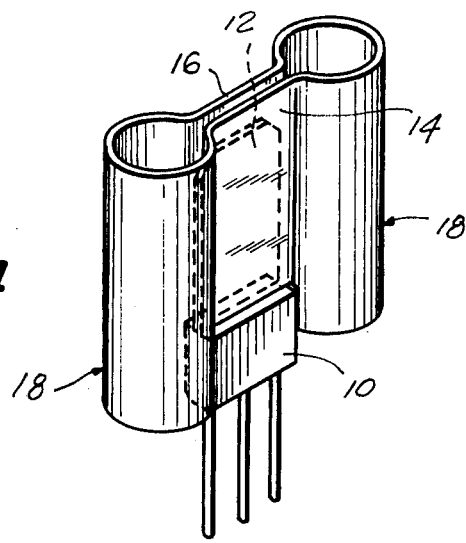
FIG. 4 is an isometric view of a second preferred embodiment of the heat dissipating device of the present invention showing the device affixed to the extending tab of a transistor.
Figure 5:
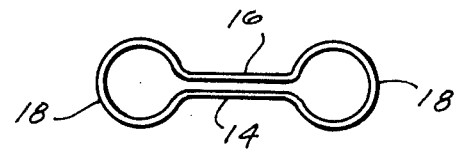
FIG. 5 is a top plan view of a second preferred embodiment of the heat dissipating device of the present invention.
Figure 6:
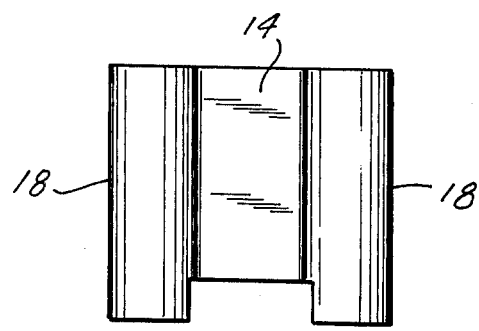
FIG. 6 is a front elevational view of a second preferred embodiment of the heat dissipating device of the present invention.

In the second preferred embodiment shown in FIGS. 4, 5 and 6, similar function is achieved by connecting members 18 which have a hollow cylindrical or tubular structure. Such structure also maximizes the surface area to permit greater heat dissipation and maintains the parallel relationship between the planar members for various size tabs. Thus, maximum area of contact is achieved and optimum heat transfer obtained.

While but two preferred embodiments of the present invention have been herein specifically disclosed for purposes of illustration, it is apparent that many variations and modifications may be made on the specific structures disclosed herein. It is intended to cover all of these variations and modifications which fall within the scope of this invention as defined by the appended claims.

We claim:

1. A heat dissipating device for mounting on the heat conductive tab of a transistor or the like having a casing in which the transistor is mounted and a heat conductive tab in thermal communication with the transistor, mounted on and extending outwardly from said casing in a given direction, said device comprising a substantially closed body comprising a pair of substantially parallelly situated planar members spaced to receive the tab therebetween with the interior surface of each substantially parallel to and in engagement with the exterior surface of the tab adjacent thereto and resilient connecting means situated on opposite ends of said members and extending therefrom in a direction substantially perpendicular to said given direction for variably spacing said planar members with respect to each other while maintaining said members substantially in said parallel relationship to permit insertion and retention of the tab therebetween.

2. The device of claim 1 wherein said means comprise a strip of heat conductive material having ends, each of which is connected to a different one of said members.

3. The device of claim 2 wherein said strip comprises a protrusion extending outwardly from said members.

4. The device of claim 2 wherein said strip comprises a pair of protrusions extending outwardly from said members.

5. The device of claim 4 wherein said protrusions form a "V" shaped configuration.

6. The device of claim 1 wherein said means are integral with said planar members.

7. The device of claim 5 wherein said protrusion comprises a pair of substantially parallelly situated spaced elements connected together at the remote end thereof.

8. The device of claim 4 wherein each protrusion forms an oblique angle with the adjacent planar member.

9. The device of claim 1 wherein said means are composed of heat conductive material.

10. The device of claim 2 wherein said strip is substantially cylindrical in shape.

11. The device of claim 10 wherein said means are integral with said planar members.

12. The device of claim 10 wherein said means are composed of heat conductive material.

13. A heat dissipating device for mounting on the heat conductive tab of a transistor or the like of the type having a casing in which the transistor is mounted and a heat conductive tab in thermal communication with the transistor, mounted on and extending outwardly from said casing in a given direction, said device comprising a substantially closed body comprising a tab engaging section and a pair of tubular sections, each of which is situated on an opposite end of said tab engaging section and extends therefrom in a direction substantially perpendicular to the given direction, said tab engaging section comprising a pair of substantially parallelly situated planar members spaced to receive and retain the tab therebetween with the interior surface of each substantially parallel to and in engagement with the exterior surface of the tab adjacent thereto, each of said tubular sections forming a connection between said planar members.

14. The device of claim 13 wherein each of said tubular sections projects outwardly from said body section.

15. The device of claim 13 wherein each of said tubular sections comprises a single heat conductive strip, each end of which is connected to a different one of said planar members.

16. The device of claim 15 wherein each of said strips is bent to form a cylindrically shaped protrusion.

17. The device of claim 13 wherein each of said tubular sections is resilient to permit variable spacing of said planar members while maintaining the parallel relationship therebetween.

18. The device of claim 14 wherein each of said tubular sections is resilient to permit variable spacing of said planar members while maintaining the parallel relationship therebetween.

19. The device of claim 15 wherein each of said tubular sections is resilient to permit variable spacing of said planar members while maintaining the parallel relationship therebetween.

20. The device of claim 13 wherein each of said tubular sections is resilient to permit variable spacing of said planar members while maintaining the parallel relationship therebetween.

* * * * *